United States Patent
Stitt

(10) Patent No.: US 7,323,880 B2
(45) Date of Patent: *Jan. 29, 2008

(54) GROUND CIRCUIT IMPEDANCE MEASUREMENT

(76) Inventor: Thomas C. Stitt, R.D. #6 Box 463, Kittanning, PA (US) 16201

( * ) Notice: Subject to any disclaimer, the term of this patent is extended or adjusted under 35 U.S.C. 154(b) by 0 days.

This patent is subject to a terminal disclaimer.

(21) Appl. No.: 11/450,168

(22) Filed: Jun. 9, 2006

(65) Prior Publication Data

US 2006/0226850 A1   Oct. 12, 2006

Related U.S. Application Data

(63) Continuation-in-part of application No. 10/640,596, filed on Aug. 13, 2003, which is a continuation-in-part of application No. 60/403,825, filed on Aug. 14, 2002.

(51) Int. Cl.
*G01R 31/08* (2006.01)
(52) U.S. Cl. ........................ 324/525; 324/509; 324/508; 324/649
(58) Field of Classification Search ................ 324/509, 324/525, 508; 361/48
See application file for complete search history.

(56) References Cited

U.S. PATENT DOCUMENTS

| | | | | |
|---|---|---|---|---|
| 3,676,739 | A | | 7/1972 | Neuhouser .................... 361/48 |
| 3,913,010 | A | * | 10/1975 | Scarpino ...................... 324/509 |
| 4,075,675 | A | * | 2/1978 | Burkett et al. ................. 361/48 |
| 4,415,850 | A | | 11/1983 | Sherwood .................... 324/509 |
| 4,609,865 | A | * | 9/1986 | Goodman et al. ........... 324/519 |
| 4,947,469 | A | * | 8/1990 | Vokey et al. ................. 324/523 |
| 5,450,328 | A | | 9/1995 | Janke et al. .................. 702/65 |
| 5,894,393 | A | * | 4/1999 | Elliott et al. .................. 361/42 |
| 6,448,780 | B1 | | 9/2002 | Jurisch ........................ 324/525 |
| 6,674,295 | B1 | * | 1/2004 | Kamitani ..................... 327/713 |

FOREIGN PATENT DOCUMENTS

JP          04032477 A   *   2/1992

OTHER PUBLICATIONS

Instruction sheet for Ground Check System, OB Systems and Mining, Huntington, WV.
Title 30, CFR from MSHA web site, 30 CFR § 75.801.
Title 30, CFR from MSHA web site, Fail safe ground check circuits on high-voltage resistance grounded systems, 30 CFR § 75.803.
Section 56/57.12028 JSHA Program Policy Manual—vol. IV, Standard for testing grounding systems.

* cited by examiner

*Primary Examiner*—Anjan Deb
*Assistant Examiner*—John Zhu
(74) *Attorney, Agent, or Firm*—Douglas Gene Glantz

(57) ABSTRACT

Novel apparatus and method accurately measure ground circuit impedance. A ground circuit and electrical current source adjusted to 25 amperes or less simulate a ground fault. Ground impedance is determined by dividing voltage drop by amperage to determine impedance directly. In one aspect, impedance is determined and displayed automatically. Power wires of the circuit being measured serve as a means for transmitting voltage and current data. The cable itself serves as a current-carrying and voltage-transmitting conduit to determine directly the circuit impedance. The novel ground circuit impedance device and method measure impedance in underground mine power systems connecting to an outside electrical power substation outside the mine and using portable transformers in the mine. The novel ground circuit impedance device and method also measure impedance in above-ground applications involving very long electrical power circuits such as those used to supply power to long conveyors and other electrical power equipment found in Metal/Non-Metal mines, including limestone quarries, sand and gravel operations, and other surface mines. In one aspect, ground circuit impedance is measured automatically in cables over 1 mile long.

10 Claims, 4 Drawing Sheets

GROUND CIRCUIT IMPEDANCE MEASUREMENT

This application is a Continuation-In-Part of U.S. patent application U.S. Ser. No. 10/640,596 filed Aug. 13, 2003, which is a Continuation-In-Part of U.S. patent application U.S. Ser. No. 60/403,825 filed Aug. 14, 2002.

BACKGROUND OF THE INVENTION

1. Technical Field

This invention relates to impedance measurement apparatus and method. In one aspect, this invention relates to the design, construction, and installation of ground circuit impedance measurement apparatus in an underground coal mine. In one aspect, this invention relates to the design, construction, and installation of ground circuit impedance measurement apparatus in other industrial applications where accurate measurement of ground circuit impedance is required.

2. Background

In underground coal mines, as well as other industrial applications, medium voltage and high voltage electrical power equipment is commonly used. As an example, in coal mines, the portable, high voltage electrical power equipment is connected to an outside electrical power substation by lengths of high voltage cable with high voltage connectors to couple the cables together as well as to portable transformers.

In order to insure the safety of mine personnel, federal laws require that all high voltage underground equipment be installed with adequate grounding means to insure that the voltage on such equipment not exceed 100 volts in the event of a ground fault (30 CFR 75.001).

INTRODUCTION TO THE INVENTION

No existing products are available which measure ground impedance on certain type circuits. The few companies that do attempt to estimate the circuit impedance do so by means of calculation which involves wire resistance tables when the wire size and length is known. What these calculations fail to take into consideration is the resistance of numerous connections such as high voltage couplers and bolted connections.

The specific problems to be overcome include providing a means of measuring impedance on a circuit which extends as much as several miles in length.

In underground mining applications, the ground fault current is limited to 25 amperes by a neutral grounding resistor. The total ground circuit impedance must not exceed 4 ohms in order to stay under the 100 volts allowed on the equipment frame. Ohm's Law shows the relationship of voltage to current and impedance:

$V=IZ$ $V=(25 \text{ amps})(4 \text{ ohms})$

Although the Federal Coal Mine Health and Safety Act of 1969 mandated the grounding requirement years ago, there remains to this day no practical means of accurately determining ground circuit impedance. The circuit impedance can be estimated by means of calculations which involve wire resistance tables when the wire size and wire length are known. These calculations fail to take into consideration the resistance of numerous connections such as high voltage couplers and bolted connections.

A product is needed to measure directly, without calculations, total circuit impedance including connection impedance.

SUMMARY OF THE INVENTION

The present invention provides novel apparatus and method for measuring ground circuit impedance including a ground circuit having an electrical current source, disconnecting electrical power by opening a main circuit breaker and a visible disconnect switch, a means of connecting power conductors, to the ground conductor at the end of the circuit, connecting an electrical alternating current source which passes current through the ground circuit, accurately measuring both the current introduced into the circuit and the resulting voltage drop produced in the ground circuit, and automatically calculating the ground impedance.

In one aspect, alligator clips are used to connect a current source to one phase wire and the ground wire. Another alligator clip is used to connect the voltage sensing device to another phase lead, which measures the voltage of that phase lead with respect to the ground wire connection. Since all phase leads are connected together at the far end of the circuit to be measured, the measures voltage is that which results from the current through the ground circuit. In applications where cable couplers are used, a special coupler may be used to conveniently connect all power conductors to the ground conductor. Power wires in the circuit to be measured serve as a means for carrying current and transmitting voltage data to determine directly the ground circuit impedance.

In underground mining applications, the novel ground circuit impedance device measures impedance in an underground mine where underground portable transformers are connected to the outside electrical power substation.

In applications which use cable couplers, inserting a special grounding coupler to provide a connection to ground off all power conductors may also be used to provide safety during inspection or troubleshooting.

Ground circuit impedance is measured automatically in cables of any length, including several miles in length.

Further embodiments of the present invention will become apparent from the detailed description which follows in conjunction with the figures of the drawings.

BRIEF DESCRIPTION THE DRAWINGS

DETAILED DESCRIPTION OF THE INVENTION

The apparatus and method of the present invention provide novel ground circuit impedance measuring in medium and high voltage electrical power systems.

Specific embodiments of the apparatus and method of the present invention include means for circulating current through a grounding circuit and measuring the voltage drop across the ground circuit to determine circuit impedance. The novel device of this invention uses one of the power wires to carry current, and another power wire as means to measure voltage.

In one aspect, the novel apparatus and method of the present invention provide a means of measuring circuit impedance on very long cables. Some uses of the present invention provide for direct measurement of either ground circuit impedance or power circuit impedance.

The apparatus and method of the high voltage coupler component, when used, of the present invention also include a preferred method of making the novel apparatus by inserting the coupler in the end of the cable coupler, a connection to ground of all three phase wires in order to provide safety during inspection or troubleshooting.

The present invention also includes a preferred method of installing and constructing the ground impedance measurement apparatus of the present invention.

One of the problems of attempting to measure the impedance of very long circuits is that the two end connections of the circuit to be measured are often miles apart.

The apparatus and method of the present invention provide for means and method for using the cable itself as a current-carrying and voltage-transmitting conduit in order to determine directly the circuit impedance.

To facilitate an understanding of the means and method of operation in accordance with the present invention, reference is made to the illustrations presented in the figures of the drawings.

Figure 1:
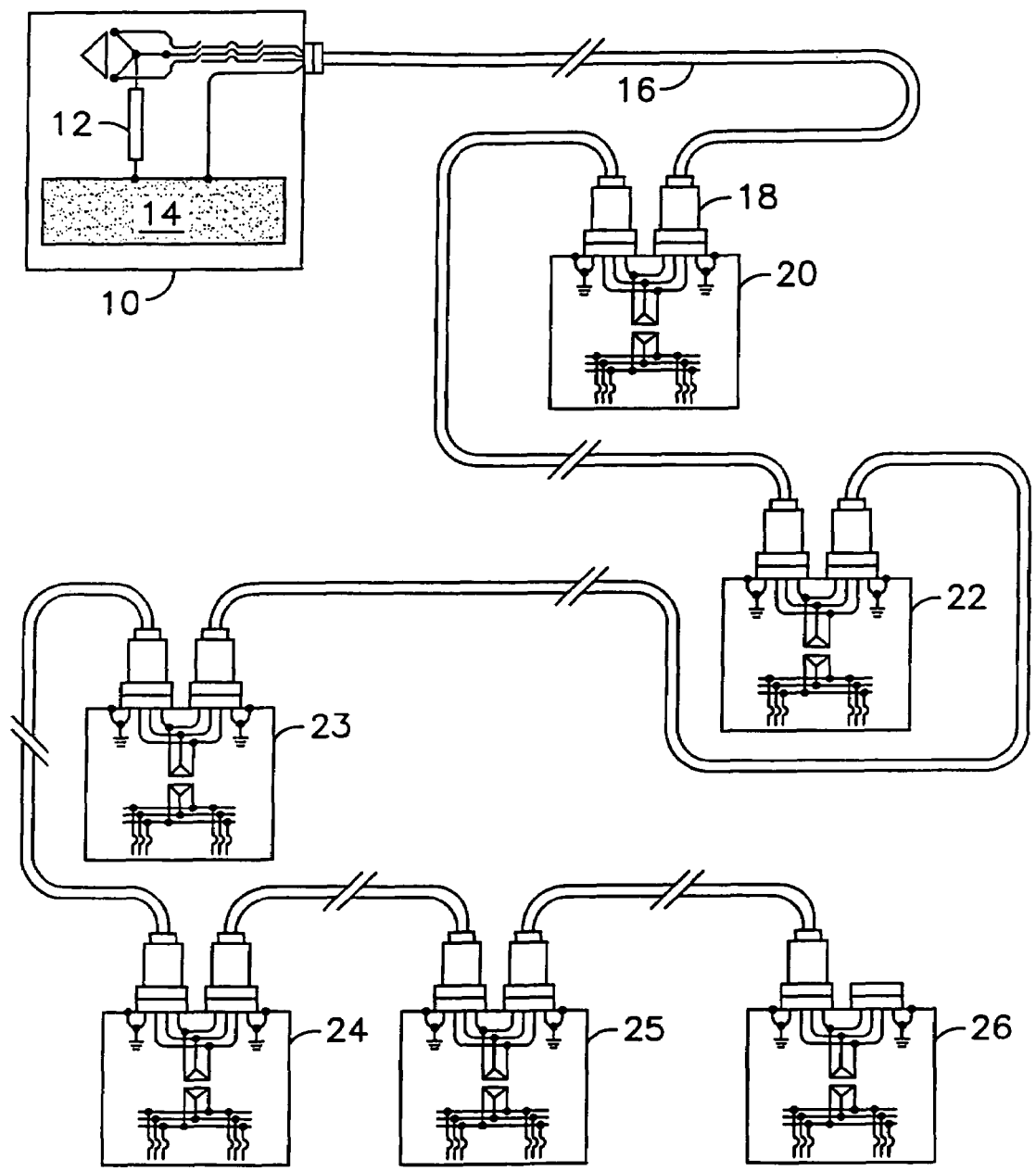
FIG. 1 is a schematic diagram of the high voltage circuit to be tested by the present invention including the ground wire and numerous connections which connect six high voltage transformer frames to an earth ground bed via a high voltage cable.

FIG. 1 is a schematic diagram of the high voltage circuit to be tested by the present invention including the ground wire and numerous connections which connect six high voltage transformer frames to an earth ground bed via a high voltage cable.

Referring now to FIG. 1, an example is shown of a typical high voltage electrical power system, as would commonly be found in an underground mine. Substation 10 is associated with neutral grounding resistor 12 and earth ground bed 14. High voltage cable 16 carries current from substation 10 to high voltage coupler 18 and step down transformer 20, 22, 23, 24, 25 and, 26, which transform the distribution voltage to utilization voltage at difference locations.

Figure 2:
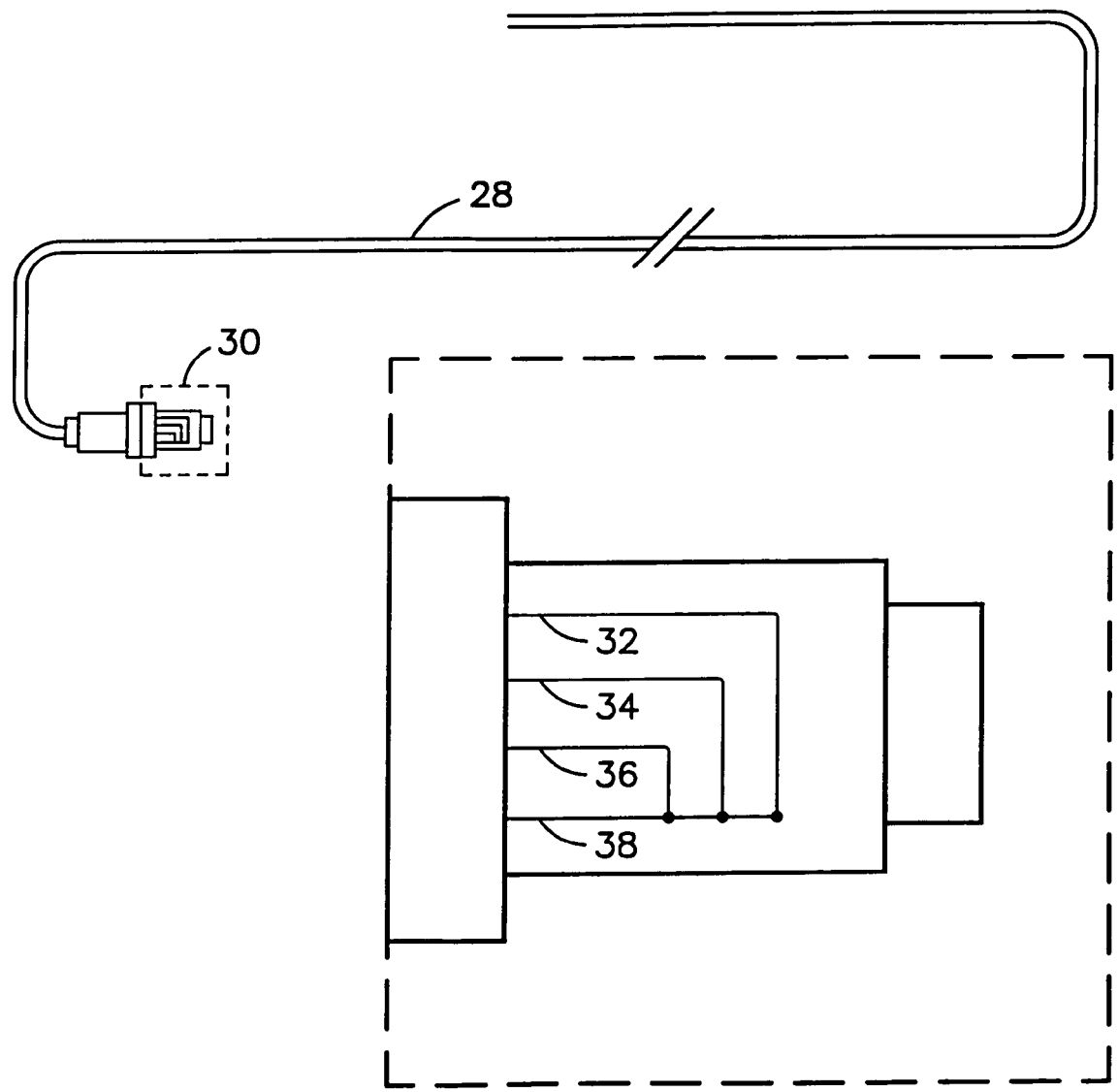
FIG. 2 is schematic diagram of a high voltage coupler of the present invention.

FIG. 2 is schematic diagram of a high voltage coupler of the present invention.

Referring now to FIG. 2, a schematic diagram illustrates a high voltage coupler of the present invention. High voltage cable 28 is connected to high voltage complex 30 which connects to all three power wires 32, 34, and 36 to ground wire 38.

Figure 3:
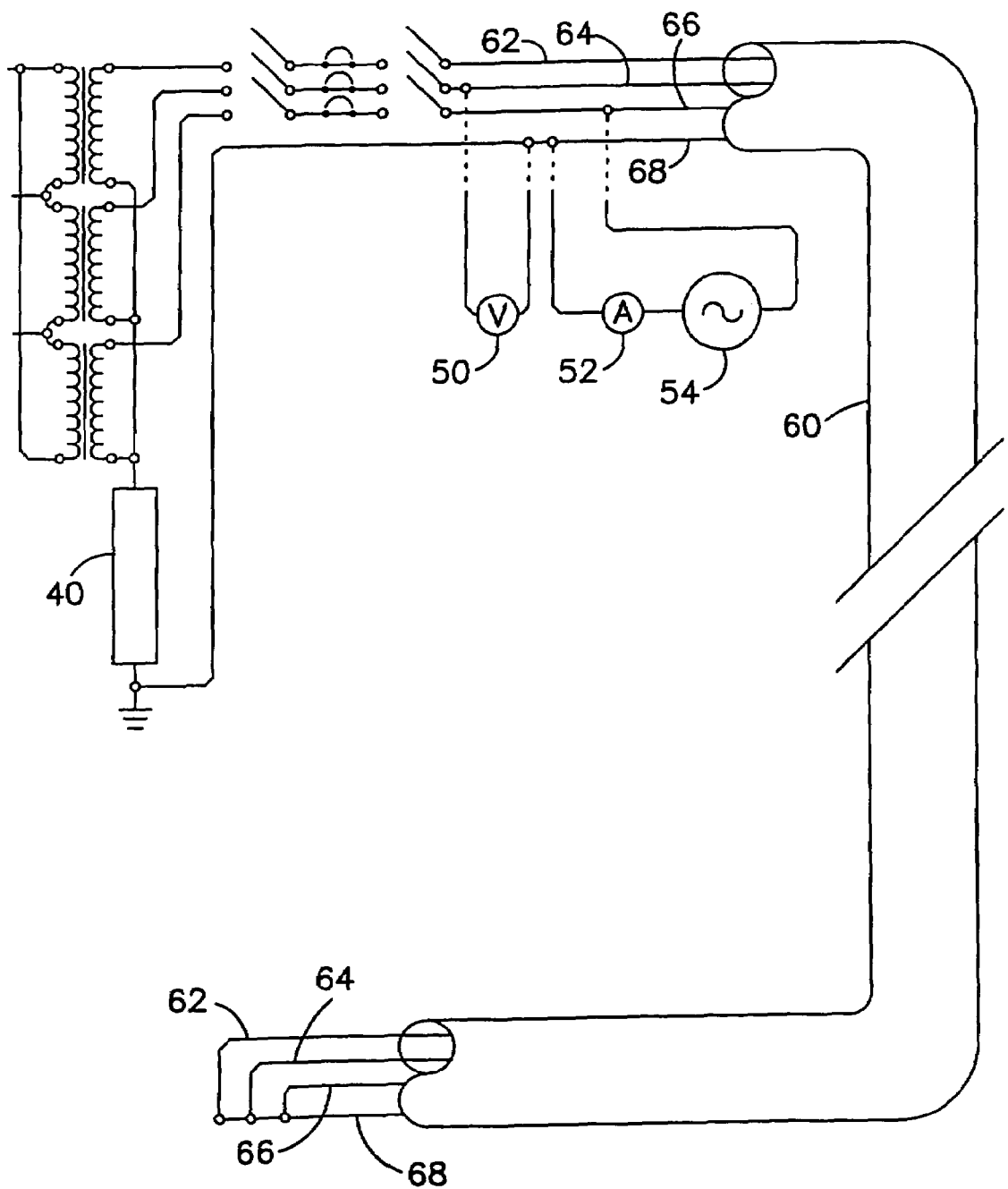
FIG. 3 is a schematic diagram of an AC current source and monitoring gauges for the apparatus and method of the present invention.

FIG. 3 is a schematic diagram of an AC current source and monitoring gauges for the apparatus and method of the present invention. Neutral grounding resistor is shown at 40. Voltmeter 50, ammeter 52, and AC current source 54 are shown connected to high voltage cable 60. Phase 1 is indicated at 62 and phase 2 is indicated at 64. Phase 3 is indicated at 66, and ground is indicated at 68.

Referring now to FIG. 3, a schematic diagram illustrates an AC current source and monitoring gauges for the apparatus and method of the present invention.

The present invention provides novel apparatus and method for accurately measuring the ground circuit impedance by completing the following simple steps. First, the power is disconnected by opening the main circuit breaker and visible disconnect switch. Next, a special high voltage coupler as illustrated in FIG. 2 is inserted into the high voltage coupler at the end of the circuit. Finally, the AC current source with ammeter and voltmeter as illustrated in FIG. 3 is connected via alligator clips to two of the phase wires and the ground wire.

The current is adjusted to 25 amperes or less, which simulates a ground fault by passing the current through the ground circuit. The voltmeter reads the total voltage drop across the ground circuit. The ground impedance, by Ohm's law, is determined by dividing the voltage reading by the current reading.

In respect to a current of 25 amperes, to allow this unit to be more compact, a smaller current is used, which consumes less power and provides for easier portability. The original concept does not change in that the ground impedance is determined by dividing the voltage by the current, but the calculation is made automatically by a microprocessor which allows the impedance to be read directly on a meter or digital display.

The apparatus and method of the present invention also are useful in locating poor connections in high voltage couplers used in underground and surface mines. Poor connections result in a higher than normal resistance circuit, which connections are detected by the apparatus and method of the present invention.

The method and procedure of the present invention used in measuring ground impedance are used for locating poor connections, but rather than connecting one of the alligator clip leads to the ground wire, all three of the leads from the AC current source are connected to the phase leads.

Several advantages are obtained through the use of the preferred apparatus and method of the present invention disclosed in the detailed description herein below. One advantage is an ability to determine accurately if the total ground circuit impedance rises to an unsafe level, where personnel may be exposed to unsafe voltage levels on equipment frames during ground fault conditions.

A further advantage of the apparatus and method of the present invention is an ability to detect poor connections in high voltage couplers which, if left undetected, could result in coupler failure due to overheating.

To facilitate an understanding of the characteristics of the invention, an underground coal mine application is used as an example.

Installation of the invention in an underground coal mine setting or elsewhere is performed by an MSHA-certified electrician who would insure that the circuit is positively disconnected before attaching the high voltage shorting coupler to the end of the cable.

The apparatus and method of the operation of the present invention provide the following differences over previously available impedance measurement devices.

Key benefits and features include the ability to accurately measure impedance directly on extremely long circuits by using the cable itself as a means of transmitting current and voltage data.

The measurement system of the present invention provides an effective and economical means to accurately determine the true impedance of a high voltage electrical power circuit or a high voltage ground circuit.

The high voltage coupler connects the three power conductors to ground at the end of the circuit being tested. This component has some noteworthy advantages over anything presently available for use in shorting power wires to ground for safety reasons during maintenance, trouble-shooting, or inspection.

Returning to the overall system, it has been found that no device is presently available which will perform the function this device does. The problem with measuring impedance on these high voltage circuits results from the very long distance which separates the two ends of the circuit. If the high voltage cable were "looped back" so that both ends of the cable were next to each other, measuring the ground circuit impedance by an ohmmeter connected to each end of the cable would provide an accurate measurement. When the cable ends are far apart, measurement with an ohmmeter requires one lead of the meter be as long as the cable which is impractical and the measurement includes the impedance of the meter lead.

The device of the present invention uses the cable itself as a meter lead to measure the voltage which results across the ground circuit when a current is applied through it. Using the novel device, the impedance of the cable used to measure, acting as a "meter lead" has no influence on the accuracy of the measurement.

In respect to the words "impedance" and "resistance," the two words are synonymous in that they both describe an opposition to the flow of electrical current, but "impedance" is used in alternating current (AC) circuits, and "resistance" is used in direct current (DC) circuits. Since the novel device has an application in AC circuits only, the correct term is "impedance." The apparatus and method of the present invention provides specifically for measuring ground circuit impedance in high voltage underground mine power systems, but is also useful in many other applications. The apparatus and method of the present invention provide accurate means of determining the true impedance of the ground circuit.

The apparatus and method of the present invention is lightweight and portable, and powered by rechargeable battery. The apparatus and method of the present invention measure impedance not just resistance. In one aspect, one pushbutton operation provides a digital display. The apparatus and method of the present invention has been found to be accurate to 0.1 ohm between 0 ohm and 10 ohms.

In applications such as resistance grounded systems where regulations permit a maximum voltage on equipment frames under ground fault conditions, it is essential the ground circuit impedance be available to operating personnel. The apparatus and method of the present invention accurately measures ground circuit impedance using novel apparatus and method which is not affected by pilot wire resistance, contact resistance, or other factors affecting conventional methods.

The present invention has been found to be useful in locating poor connections in high voltage couplers used in underground and surface mines. Poor connections result in higher than normal resistance circuit, which can be easily detected by this device.

The same procedure used in measuring ground impedance is used, but rather than connecting one of the alligator clip leads to the ground wire, all three of the leads from the AC current source would be connected to the phase leads.

The apparatus and method of the present invention operate in a manner to measure ground circuit impedance in long electrical circuits by using the power conductors as voltage and current conduits. Also, the apparatus and method of the present invention operate to simulate a ground fault by passing current through the ground circuit, measuring current and voltage, and calculating impedance directly from these measurements. In one embodiment, the apparatus and method of the present invention with certain modifications are used not only to measure impedance in high voltage electrical circuits, such as those used in underground mining, but also are used in applications in other industries. In one aspect, the MSHA Mine Safety and Health Administration has a requirement in Metal/Non-Metal mines, including limestone quarries, sand and gravel operations, and other surface mines, such that the ground impedance must be measured at least once a year. There was no convenient means to accomplish this measurement, until now, as provided by apparatus and method of the present invention.

The apparatus and method of the present invention works well on high voltage power systems, but also works well on other than high voltage power systems. The apparatus and method of the present invention are suitable for use in both high voltage power applications and low and medium voltage applications. By high voltage is meant grater than 1000 volts, and by low and medium voltage is meant less than 1000 volts.

A significant difference found in low and medium voltage uses compared to high voltage uses is the manner in which the power phases are grounded at the far end of the circuit. As disclosed herein above, a high voltage grounding plug is used to ground safely the power phases to accomplish the impedance measurement. The grounding plug is used when the measurement is made on high voltage circuits. If the measurement is made on low or medium voltage circuits, an alternative, simpler grounding method is used. In the case of low or medium voltage circuits, the grounding is done by attaching a temporary grounding jumper to each power wire, or a specially-designed, inexpensive "test-point" is installed permanently on the equipment which can easily be grounded to make the test.

In one aspect, it has been found that the measuring instrument apparatus and method of the present invention operates by a simple, one-button operation. The measuring instrument apparatus and method of the present invention, when activated, uses microprocessor technology to apply automatically the proper current, to determine accurately the magnitude of the current and resultant voltage, and finally to compute and display the impedance of the ground circuit to the nearest one-tenth of an ohm.

In one aspect, it has been found that the measuring instrument apparatus and method of the present invention operates in a considerable physical size reduction; now being small enough to be held in one hand. The measuring instrument apparatus of the present invention is portable and self-powered. A much simpler and less expensive power supply is used which makes use of inexpensive AA batteries.

Figure 4:
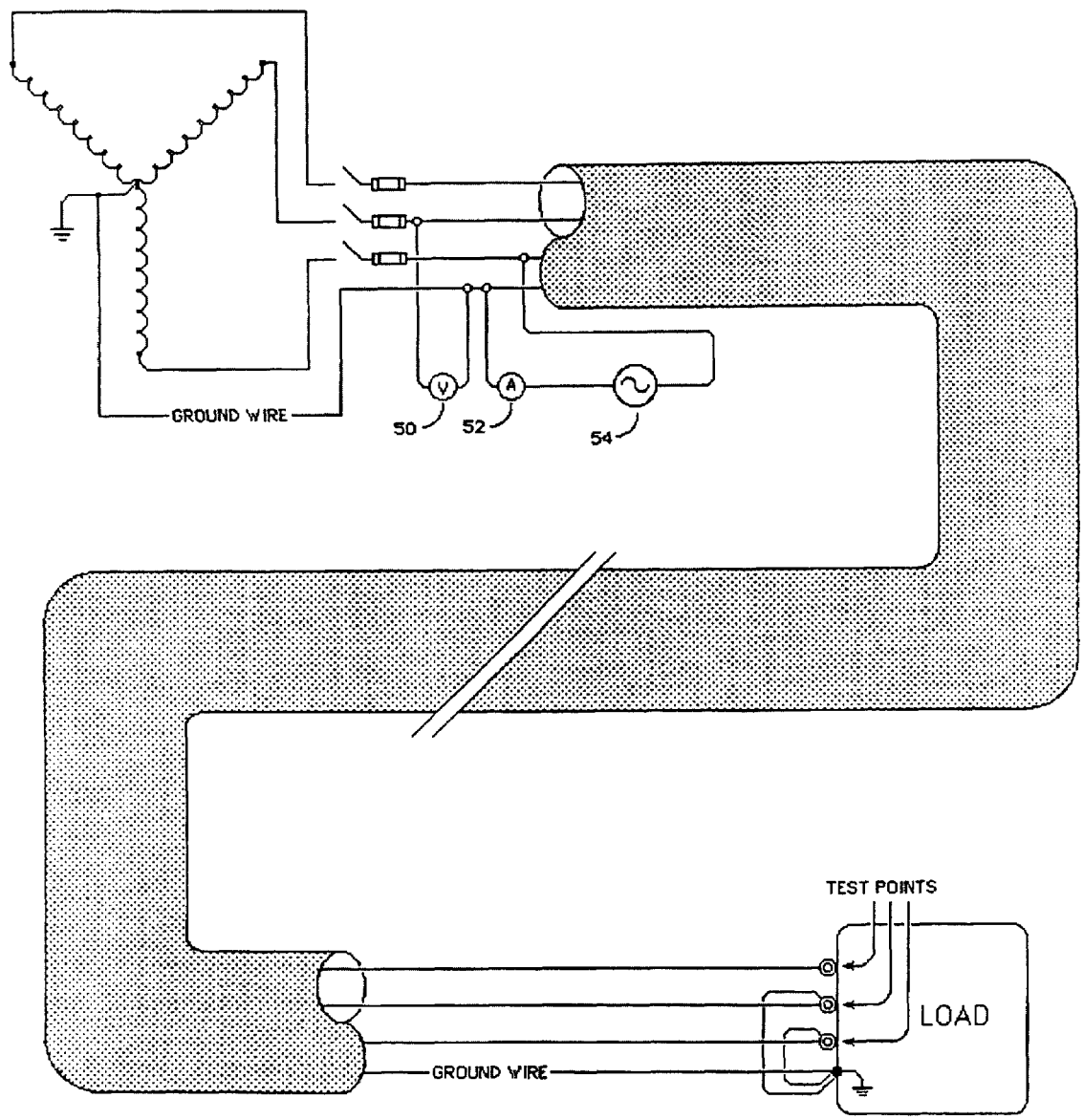
FIG. 4 is a schematic diagram of the apparatus and method of the present invention as applied to a low or medium voltage circuit

FIGS. 1, 2, and 3 of the drawings describe the apparatus and method of the present invention as applied to measuring impedance on a high voltage circuit. FIG. 4 of the drawings describes the apparatus and method of the present invention as applied to a low or medium voltage circuit, such as those circuits commonly found at surface operations. FIG. 4 shows a difference in the substitution of low or medium voltage in place of high voltage. A high voltage grounding plug is not shown in FIG. 4.

It is significant that the device uses four wires to perform the impedance measurement. The connection to the ground wire which provides the voltage measurement, 50, on FIG. 3 and FIG. 4, is a separate connection from the one that connects the current source, 54, to ground and measures the current, 52. By using this method, neither the individual impedances of the connection points nor the impedance of the connecting wires have any effect on the accuracy of the ground impedance measurement. The connection and lead wire impedances do indeed have an effect on the amount of current provided by the current source, but the device accurately measures whatever current is produced and compares it to the voltage measurement to determine the impedance. Also, any impedance in the voltage-measurement circuit, either from connection point impedance or lead wire impedance, would have to be extraordinarily high to have any effect on the voltage measurement since the voltage measurement circuit is, by its very nature, a high impedance circuit.

The apparatus and method of the present invention as shown and illustrated in the detailed description of the specification and the accompanying figures of the drawings are not intended to be limited to the specific examples shown and described, but the apparatus and method of the present invention are intended to include the novel developments encompassed by the claims which follow and equivalents thereof.

What is claimed is:

1. A method for measuring ground circuit impedance, comprising:
    a) providing a ground circuit having three phase wires and a ground wire, and an electrical current source for supplying electrical power to the ground circuit;
    b) disconnecting the electrical power by opening a main circuit breaker and a visible disconnect switch;
    c) grounding the phase wires at the end of the circuit;
    d) connecting the electrical current source with an ammeter and a voltmeter;
    e) providing and adjusting current to 25 amperes or less, thereby simulating a ground fault by passing the electrical current through the ground circuit;
    f) measuring total voltage drop across the ground circuit; and
    g) determining ground impedance by dividing the total voltage drop by the electrical current to determine impedance directly.

2. The method for measuring ground circuit impedance of claim 1, wherein the ammeter and voltmeter are connected by alligator clips to two phase wires and to two separate points on the ground wire.

3. The method for measuring ground circuit impedance of claim 1, wherein the impedance is determined and displayed automatically.

4. The method for measuring ground circuit impedance of claim 1, wherein the phase wires of the circuit being measured serve as a means for transmitting voltage and current data.

5. A method for measuring a ground circuit impedance of claim 1, comprising measuring impedance in an underground mine.

6. A method for measuring ground circuit impedance of claim 1, comprising connecting the four wires of the cable to an outside electrical power substation outside an underground mine.

7. A method for measuring ground circuit impedance of claim 1, comprising inserting a coupler in the end of a cable coupler on the cable to provide a connection to ground of all three phase wires to provide safety during inspection or troubleshooting.

8. A method for measuring ground circuit impedance of claim 1, comprising using the cable itself as a current-carrying and voltage-transmitting conduit to determine directly the circuit impedance.

9. A method for measuring ground circuit impedance of claim 1, comprising measuring impedance in a cable over 1 mile long.

10. A method of measuring ground impedance by dividing an indicated voltage by an indicated current on cables longer than one mile having a three phase wires and a ground wire, comprising:
    a) providing a ground circuit in an underground coal mine having an electrical current source for providing electrical power to the ground circuit;
    b) disconnecting power by opening a main circuit breaker and a visible disconnect switch;
    c) grounding the end of the circuit;
    d) connecting the electrical current source with an ammeter and voltmeter by alligator clips to two phase wires and to two separate points on the ground wire;
    e) providing and adjusting electrical current to 25 amperes or less, thereby simulating a ground fault by passing the electrical current through the ground circuit;
    f) measuring total voltage drop across the ground circuit wherein the phase wires of the circuit being measured serve as a means of transmitting voltage and current data; and
    g) determining ground impedance by dividing the voltage drop by the current reading to determine impedance directly and displaying the impedance on an impedance display on a measuring instrument automatically.

* * * * *